United States Patent [19]

Yamagata

[11] Patent Number: 5,016,220
[45] Date of Patent: May 14, 1991

[54] SEMICONDUCTOR MEMORY DEVICE WITH LOGIC LEVEL RESPONSIVE TESTING CIRCUIT AND METHOD THEREFOR

[75] Inventor: Tadato Yamagata, Hyogo, Japan

[73] Assignee: Mitsubishi Denki Kabushiki Kaisha, Tokyo, Japan

[21] Appl. No.: 441,005

[22] Filed: Nov. 27, 1989

[30] Foreign Application Priority Data

Nov. 28, 1988 [JP] Japan .................................. 63-301437

[51] Int. Cl.⁵ .......................... G11C 7/00; G11C 29/00
[52] U.S. Cl. ................................ 365/201; 365/189.01; 365/230.03; 371/21.1
[58] Field of Search .............. 365/201, 189.01, 230.03; 371/21.1, 21.2

[56] References Cited

U.S. PATENT DOCUMENTS

| | | | |
|---|---|---|---|
| 4,661,930 | 4/1987 | Tran ........................................ | 365/201 |
| 4,672,582 | 6/1987 | Nishimura et al. .................. | 365/201 |
| 4,692,901 | 9/1987 | Kumanoya et al. ................. | 365/201 |
| 4,860,259 | 8/1989 | Tobita ........................ | 365/189.01 X |
| 4,873,669 | 10/1989 | Furutani et al. ...................... | 365/201 |
| 4,899,313 | 2/1990 | Kumanoya et al. ................. | 365/201 |
| 4,916,700 | 4/1990 | Ito et al. ................................ | 365/201 |

OTHER PUBLICATIONS

"A 90 ns 4Mb DRAM in a 300 Mil Dip", by Mashiko et al., Intn'l Solid-State Circuits Conf. 1987, WAM 1.1, pp. 12, 13, 314, 315.

"A 90 ns 1Mb DRAM with Multi-Bit Test Mode" by Kumanoya et al., Intn'l. Solid-State Circuits Conf. 1985, FAM17.2, pp. 240, 241, 352.

Primary Examiner—Stuart N. Hecker
Assistant Examiner—Michael A. Whitfield
Attorney, Agent, or Firm—Lowe, Price, Leblanc, Becker & Shur

[57] ABSTRACT

A testing circuit for a semiconductor memory device is provided. An AND operation is performed on the data read out from each block of a memory cell array when the bit data written into each block of the memory cell array for testing is "1", and a NOR operation is performed on the data read out from each block of the memory cell array when the bit data written into each block of the memory cell array is "0". In this manner, even when the data read out from the blocks are all inverted in their logical states through error, such error can be detected.

8 Claims, 6 Drawing Sheets

SEMICONDUCTOR MEMORY DEVICE WITH LOGIC LEVEL RESPONSIVE TESTING CIRCUIT AND METHOD THEREFOR

BACKGROUND OF THE INVENTION

The present invention relates generally to testing circuits in semiconductor memory devices, and more particularly, to a testing circuit in which information for tests are written in corresponding memory cells in each of a plurality of blocks in a memory cell array and simultaneously read out, and a logical operation is performed on the information as read out to determine the results of the tests.

DESCRIPTION OF BACKGROUND ART

Field of the Invention

The degree of integration of a dynamic RAM, referred to hereinafter as DRAM, has been increasing rapidly. Presently, the 1 M DRAM is in the state of mass production, while a 4 M DRAM is about to be commercially produced. With increase in the memory capacity of the DRAM, the time involved in the pre-shipping testing is also increased to such extent that the increase in the product cost caused by the increase in the testing time has become excessive. For this reason, a so-called test mode has come to be built into a device, according to which a plurality of bit data from the bit data once written in a selected location in each memory block in a 1 M DRAM, are read-out simultaneously from these locations in the blocks of 1 M DRAM, the result of the logical operation performed on these read-out bit data is outputted and the output data is used to check as to whether the reading and writing have been made correctly. With the use of this test mode, testing time can be reduced significantly because a plurality of data can be then tested simultaneously.

FIG. 1 shows a conventional semiconductor memory device equipped with the above described testing mode. It is noted that the semiconductor memory device of FIG. 1 is a 1 M DRAM. In this figure, a memory cell array 1 containing 1 M bits is divided into eight blocks each containing 128 K bits, and data buses I/O1 to I/O8 are provided for the respective blocks. Various switching methods have been proposed for switching between an ordinary mode and a testing mode. As an example, when the external signal $\overline{RAS}$ (row address stobe signals), $\overline{CAS}$ (column address stobe signals) and $\overline{WE}$ (write enable signals) are changed at a timing known as WCBR ($\overline{WE}$, $\overline{CAS}$ before $\overline{RAS}$) shown for example in FIG. 2, the mode is switched from the ordinary mode to the testing mode. That is, when the $\overline{CAS}$ and $\overline{WE}$ are set to a "L" level before $\overline{RAS}$ goes low, the mode is the testing mode. It is noted that, in the ordinary mode, it does not occur that $\overline{CAS}$ and $\overline{WE}$ be set to the low level before $\overline{RAS}$ goes low. A test enable signal TE outputted from a clock generator 2 goes at this time to a "H" level, so that a switch 3, connected in the ordinary mode to a terminal N1, is now connected to a terminal N2.

The operation of the semiconductor memory device shown in FIG. 1 is hereafter explained.

(1) Operation for Ordinary Mode

During read-out, address signals are transmitted via an address buffer and a predecoder 4 to a row decoder 1a and a column decoder 1b. The bit data stored in the memory cells selected from the output of these decoders 1a and 1b are read out, each one from the eight memory cell blocks, so as to be outputted to data buses I/O1 to I/O8. These 8-bit data are amplified by a preamplifier 8. Then, by signals $\phi 1$ and $\overline{\phi 1}$ outputted from the address buffer and predecoder 4, 4-bit data are formed by selection from the above 8-bit data by transistors 10 to 17. For example, when $\phi 1 =$ "H" and $\overline{\phi 1} =$ "L", bit data on the data buses I/O1, I/O2, I/O5 and I/O6 from the 8-bit data on the data buses I/O1 to I/O8 are selected and transmitted to the data buses D1, D2, D3 and D4, respectively. Then, by outputs from a nibble decoder 5, adapted to perform decoding of $RA_9$ and $CA_9$, most significant address bit signals, a 1-bit data is selected from the above 4-bit data. Since the switch 3 is connected to the side of the terminal N1, during the ordinary mode, as described hereinabove, the selected 1-bit data is outputted to an external output pin via an output buffer 6.

Then, during writing, input data Din entered from an external input pin, are entered simultaneously into four input buffers 7. Only one input buffer is enabled by the nibble decoder 5 so that the input data stored in the enabled buffer is transmitted to an internal circuit by a clock $\phi 2$. The clock $\phi 2$ is used for outputting data of the input buffer 7 to an internal circuit only when $\phi 2 =$ "L" and is usually at an "H" level. For example, it is assumed that the input data has been applied only to the data bus DI1. Also, it is determined by signals $\phi 5$ and $\overline{\phi 5}$ supplied from the address buffer and the predecoder 4 whether the data should be transmitted via a transfer gate 18 to the memory cell array 1 or via a transfer gate 20 to the memory cell array 1. For example, when $\phi 5 =$ "H" and $\overline{\phi 5} =$ "L", the input data is transmitted via an input write buffer 9 to the data bus I/O1 so as to be written into a memory cell selected by the row decoder 1a and the column decoder 1b.

(2) Operation for Testing Mode

During writing in the testing mode, the address buffer and the predecoder 4 are controlled so that $\phi 5_a = \phi 5_b =$ "H". For the test mode, $\phi 5_a$ and $\overline{\phi 5}$ are forced to be equal to each other by a test enable signal TE from the clock generating circuit 2. Also, the nibble decoder 5 is controlled so that the four input buffers 7 are enabled. Thus, during writing in the testing mode, the input data Din supplied from the external input pin are transmitted to the data buses I/O1 to I/O8, at the same time that the clock signal $\phi 2$ goes "L", in such manner that the input data Din are written into the memory cells selected by the row decoders 1a and the column decoders 1b of the eight memory cell blocks. In this manner, during writing in the testing mode, the input data are written simultaneously into eight memory cells, one from each of the eight memory cell blocks.

During read-out, the eight bit data stored in the memory cells selected by the row decoder 1a and the column decoder 1b are read out simultaneously, one from each of the eight memory cell blocks, so as to be outputted to the data buses I/O1 to I/O8, as in the ordinary mode as described above. These bit data were written simultaneously, as described above, so that these should be one and the same data. These 8-bit data are amplified by the preamplifier, and then are entered into an $\overline{EOR}$ circuit 26 (exclusive NOR) adapted to perform an exclusive NOR arithmetic operation. Since the switch 3 is connected during the testing mode to the terminal N2, as described above, the output of the $\overline{EOR}$ circuit 26 is transmitted via an output buffer 6 to the external output pin. As described above, the 8-bit data, entered to the EOR circuit, should be one and the same data if the storage operation has been performed correctly. In this case, the output of the $\overline{EOR}$ circuit is at the "H" level, with the output to the outside being also at the "H" level. If the state of at least one of the eight bits is inverted such that the bits in the "H" level and the bits in the "L" level exist together at the inputs to the $\overline{EOR}$ circuit 26, the output of the $\overline{EOR}$ circuit 26 is at the "L" level, with the output to the outside also being at the "L" level. In this manner, during testing mode, the storage operation of a plurality of bits can be tested simultaneously by checking for the level of the output data Dout from the external output pin so that the testing time can be reduced significantly.

FIG. 3 shows another prior art example. In this figure, there is shown an example of a 4 M DRAM loaded with a testing mode made public in the ISSCC (1987) (1987 International Solid-State Circuits Conference, WAM1.1). In FIG. 3, a switch SW is opened by a clock $\phi T$ during read-out in the testing mode. An exclusive OR circuit is constituted by OR circuits 27 and 28, AND circuits 29 and 30 and a NAND circuit 31, such that an exclusive OR arithmetic operation is performed with respect to the 8-bit data read-out from the eight memory cell blocks. The results of this arithmetic operation represent the test results. Thus, in the prior art example of FIG. 3, the storage operation of the eight bits is tested simultaneously, as in the case of the prior art example of FIG. 1. In FIG. 3, PA1 to PA4 and P5 to P8 indicate preamplifiers.

The prior art devices shown in FIGS. 1 and 3 are, however, inconvenient in that, inasmuch as the $\overline{EOR}$ circuits are used for checking the test results, if all of the 8-bits should be inverted to the mistaken data side, the output data to the outside are at "H" level, as when the storage operation has been made correctly, so that, in this case, the errors can not be detected.

The testing mode described above is of the so-called "1, 0 checking system", according to which the normal or abnormal states are checked in dependence upon whether the output to the outside is at the "H" or "L" level. As a partial solution to provide a checking method free of the above described defects, a system called "1, 0, Hi-Z checking method" has also been proposed. An example of the checking circuit according to this system is shown in FIG. 4.

In this figure, the data buses I/O1 to I/O8, preamplifiers 8 and a terminal N1 are the same as the components indicated by the same symbols in FIG. 1. In this case, output buffer 6 does not require a latch and may be as shown in FIG. 4. The clock signal TE is at "H" level in the testing mode and at "L" level at the ordinary mode, as described with reference with FIG. 1. Vcc indicates a source voltage. The clock signal $\phi 3$ is the same as the clock signal $\phi 3$ in FIG. 1 and represents an output enable signal. That is, when $\phi 3 =$ "H", output data is supplied to an output terminal Dout. During the ordinary mode, the TE = "L" and the $\overline{TE}$ = "H", so that transfer gates 34 and 36 are turned on and transfer gates 35 and 37 are turned off. At this time, $\phi 3$ is at "H" level and the output data supplied to the terminal N1 is supplied to the output terminal Dout.

During the testing mode, TE = "H" and $\overline{TE}$ = "L", so that the transfer gates and 34 and 36 are turned off and the transfer gates 35 and 37 are turned on. In this case, the output data Dout from the output terminal is determined in accordance with the outputs of the AND circuit 32 and the NOR circuit 33. That is, when the data supplied to the data buses I/O1 to I/O8 are all at the "H" level, the output of the AND circuit 32 is at the "H" level, while the output of the NOR circuit 33 is at "L" level so that Dout = "H". On the other hand, when all the data of the eight bits are at "L", the output of the AND circuit 32 is at "L", while the output of the NOR circuit 33 is at "H", so that Dout = "L". When "H" bits and "L" bits exist together in the 8-bit data, the output of the AND circuit 32 is at "L" level, while the output of the NOR circuit 33 is at "L", so that the transistors 38, 39 are both turned off and the state of Dout = High - Z (state of high impedance) is established. In this manner, with adoption of the "1, 0, High - Z checking system", the state of all of the eight bits being "L" and the state of all of the eight bits being at "H" level can be discriminated from each other by the state of the external output terminal impedance, so that, in distinction from the prior art example of FIG. 1 or 3 in which "1, 0 checking system" is employed, it becomes possible to check for the errors in which all of the 8-bit data written into the memory are inverted since NOR gate 33 will cause Dout to assume a low impedance "L" state under such a circumstance. States of operation in the test mode are shown in the following table for reference.

|      | 38  | 39  | Dout   |
|------|-----|-----|--------|
| ALL1 | ON  | OFF | H-LoZ  |
| 1 + 0 | OFF | OFF | Hi-Z   |
| ALL0 | OFF | ON  | L-LoZ  |

It should be noticed that the primary object of introducing the testing mode is to reduce the time in shipping after assembly or in the inspection of wafers at the DRAM manufacturer. However, a demand has been raised recently among the users to make use of this testing mode function for reducing the testing time for DRAMs built into pre-existing systems For example, it has been desired that the DRAMs utilized as the main memories of computers be built into the pre-existing system so as to be used in the testing employing the CPUs or firm ware appropriate to the system. In the shipping tests by manufacturers or simple acceptance tests by users, dedicated memory testers are customarily used, in which case a testing mode employing the above described "1, 0, Hi - Z checking system" may also be used. However, in the case of testing RAMs built into a system, it is extremely difficult to check for the Hi-Z states of the output terminal. In this case, the "1, 0, Hi - Z checking system" cannot be employed conveniently. Thus, the demand raised by the users cannot be satisfied by the testing mode employing the "1, 0, Hi - Z checking system".

As described above, the embodiments shown in FIG. 1 and FIG. 3 in which $\overline{EOR}$ circuits are used for checking the test results, errors cannot be detected in which all of the bits arranged in parallel have been inverted to the incorrect logic level. Also, if the 1, 0, Hi - Z checking system of the prior art example shown in FIG. 4 is used to obviate this inconvenience, another problem is presented in that, when a RAM built into a pre-existing system is to be tested by the user, the state of Hi-Z cannot be distinguished.

SUMMARY OF THE INVENTION

It is therefore an object of the present invention to provide a testing circuit in which any type of errors can be detected when a plurality of bits are tested in parallel.

It is another object to provide a testing circuit which is suited to tests of semiconductor memory devices built into pre-existing system.

In accordance with the present invention, there is provided a testing circuit for a semiconductor memory device which comprises an array of memory cells divided into a plurality of blocks and for selecting a desired memory cell in each of said blocks, said testing circuit further comprising: writing means for selecting a memory cell in each block by selecting means and writing the bit data of the same logical state in the selected memory cells; read-out means for reading out data stored in the memory cell of each block in which writing has been made by said writing means; testing result checking means for performing a logical operation on the data read out from the memory cell in each block by said read-out means and outputting the checked results of the test; and logical operation switching means for switching the logical operation in said test result checking means between a first state and a second state in dependence upon whether the bit data written into the memory cell of each block by said writing means is in the first logical state or in the second logical state.

According to the present invention, the logical operations employed for checking the test results are switched between two states or modes in dependence upon whether the bit data to be written into associated memory cells of the blocks of the memory cell array for testing is in a first logical state or in the second logical state, so as to cope with any type of errors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
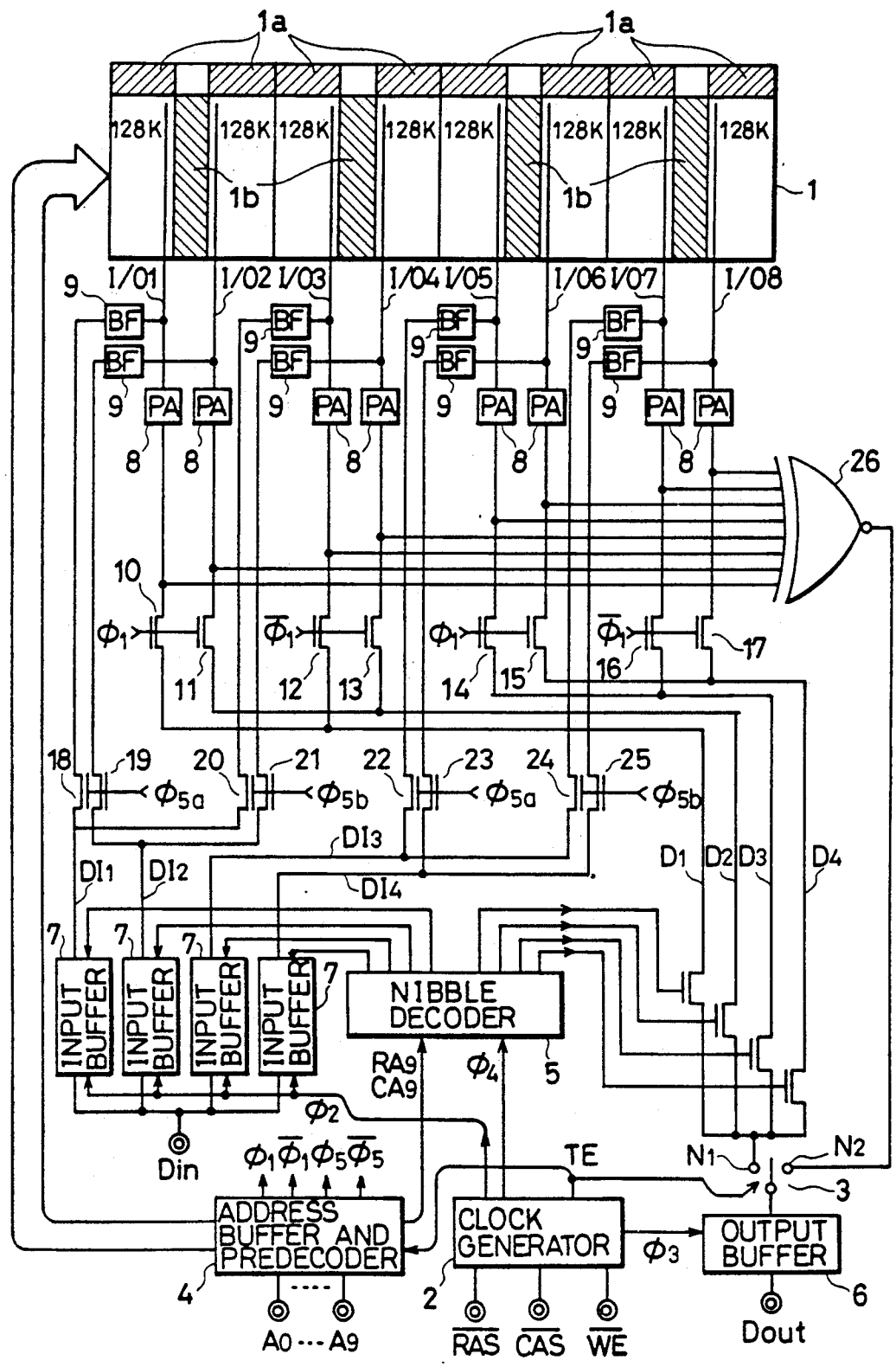
FIG. 1 is a circuit diagram showing the construction of a test circuit in a conventional semiconductor memory device.
Figure 2:
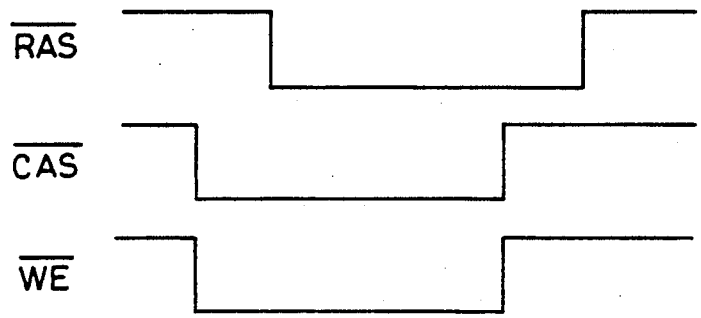
FIG. 2 is a time chart showing the timing relation between signals necessary for starting a testing mode in the embodiment shown in FIG. 1.
Figure 3:
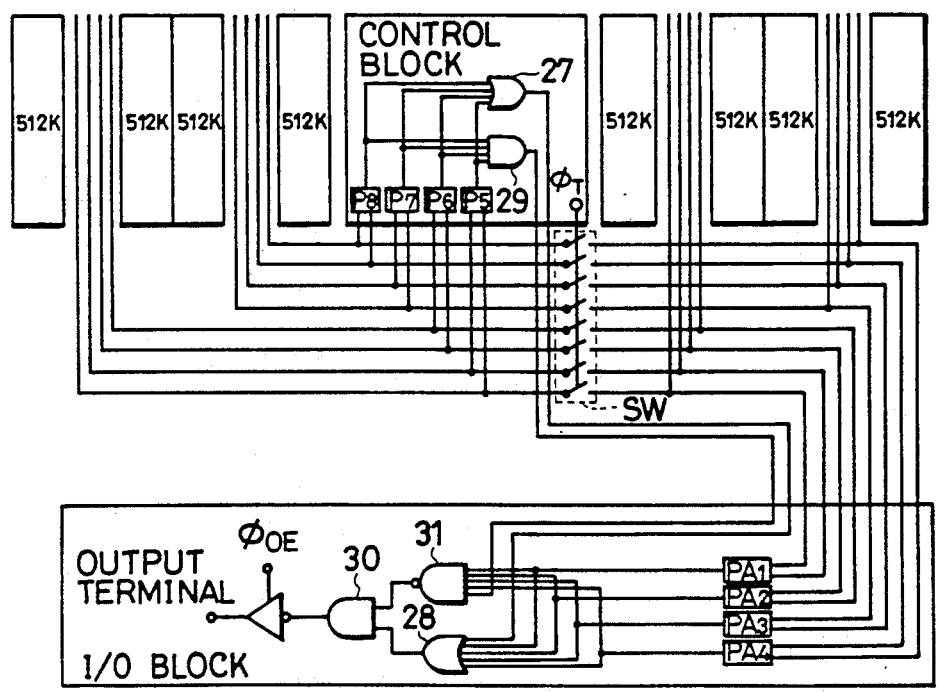
FIG. 3 is a circuit diagram showing another example of the conventional testing circuit.
Figure 4:
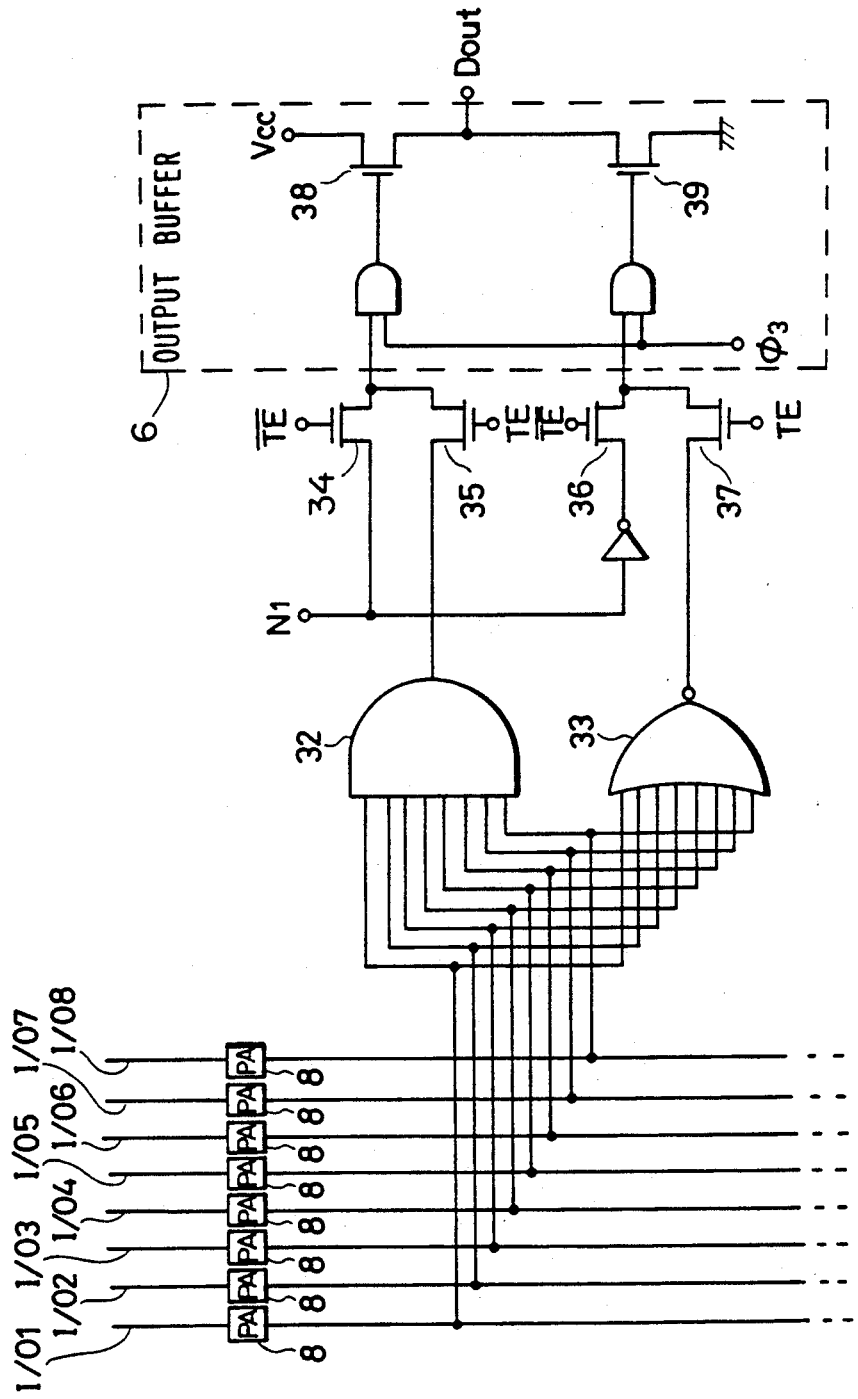
FIG. 4 is a circuit diagram showing still another example of the conventional testing circuit.

Prior to the description of specific embodiments (FIGS. 5 and 6) of the present invention, the embodiments of FIGS. 5 and 6 will be schematically described with reference to the function block diagram of FIG. 7. Referring to FIG. 7, a semiconductor memory and a testing circuit therefor are integrally formed on a common substrate. Test data inputted from an input terminal Din are written in a selected memory cell (selected by a row decoder 1a and a column decoder 1b) in each block of the memory cell array 1. On this occasion, the test data are held by latch means 42. When writing of the test data to the selected memory cell in each block is completed, the data are collectively read from the selected memory cell of each block. The read data are amplified by a preamplifier 8 to be applied to the first and second logic means 101 and 102, where prescribed logic operations are carried out. Transfergate means 103 selects an output from the first or the second logic means in response to logic level of the test data previously held in the latch means 42. The output from the transfer gate means 103 is applied to an output terminal Dout through a switch 3 and an output buffer 6. Therefore, in response to the logic level of the test data, proper logic operation is always carried out on the data read from the memory cell in each block. Consequently, even if errors are generated in all the bits of the read data, these errors can be detected.

Figure 5:
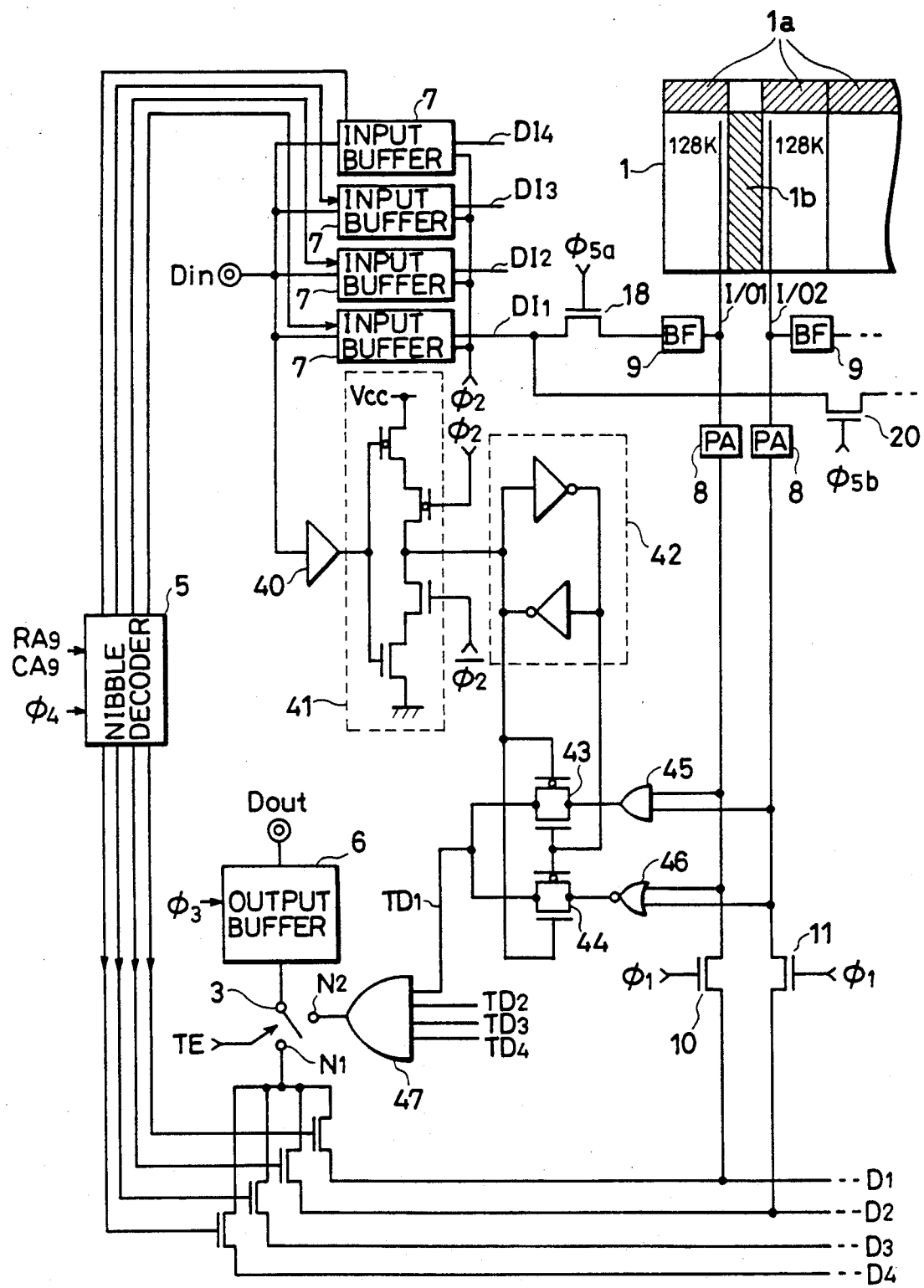
FIG. 5 is a circuit diagram showing the construction of an embodiment of the present invention.

FIG. 5 is a circuit diagram showing an arrangement of an embodiment of the present invention, wherein the parts which are the same as or equivalent to those of the prior art example of FIG. 1 are indicated by the same reference numerals and the corresponding description is omitted. In the figure, Vcc denotes a source voltage. Although not shown in FIG. 5, the address buffer, address predecoder 4 and the clock generator 4 are the same as those shown in FIG. 1 and are similarly provided in FIG. 5. The difference of the present embodiment from the prior art example of FIG. 1 is that there is provided, in place of the $\overline{EOR}$ circuit 26 as the testing mode logic circuit of FIG. 1, a testing mode logic circuit consisting mainly of a buffer circuit 40, a clocked CMOS transfer gate circuit 41, a latch circuit 42, transfer gates 43, 44 consisting of a P-channel MOSFET and a N-channel MOSFET, respectively, AND circuits 45, 47 and a NOR circuit 46.

The operation of the embodiment of FIG. 5 is hereafter explained.

(1) Operation for Ordinary Mode

The operation during the ordinary mode is precisely the same as that of the prior art example shown in FIG. 1, both as to the writing operation and the read-out operation, so that the corresponding description is omitted.

(2) Operation for Testing Mode

During writing in the testing mode, $\phi 5_a = 5_b =$ "H" and the nibble decoder 5 is controlled to enable all of the four input buffers 7. Thus, the input data Din entered at the external input pin are transmitted simultaneously to the data buses I/O1 to I/O8, at the timing when the clock signal $\phi 2$ goes to "L", and are written into the memory cells selected by the row decoder 1a and the column decoder 1b of each of the eight memory cell blocks. Hence, during writing in the testing mode, the input data are written simultaneously into eight memory cells, one in each of the memory cell blocks. This operation is the same as that of the conventional circuit shown in FIG. 1. The difference of the present embodiment from the conventional circuit in the circuit operation is that, during writing, the input data Din are additionally latched in latch 42 and the mode of the logical arithmetic operation of the testing mode logic circuit is switched in dependence upon the value of the latched data. That is, during writing, the input data is fetched into the latch circuit 42 via the buffer circuit 40 and the clocked CMOS circuit 41 when the clock signal φ2 goes to "L". The clock signal φ2 is a signal which goes to "L" when the input data is transmitted to an internal circuit and goes high at other times. Therefore, during the ordinary mode, the input end and the output end of the clocked CMOS circuit 41 are disconnected from each other so that the input data written most recently is to be maintained in the latch circuit 42. The transfer gates 43 and 44 are controlled in accordance with the data thus maintained in the latch circuit.

During reading in the testing mode, the bit data are read out simultaneously from the respective clocks of the memory cell array 1, in the same way as in the conventional circuit shown in FIG. 1, and are outputted to the data buses I/O1 to I/O8. When the input data maintained in the latch circuit 42 is at "H" level, transfer gates 43 and 44 are turned on and off, respectively, so that the output of the AND circuit 45 having data buses I/O1 and I/O2 as the inputs is entered into an AND circuit 47 via node TD1. Similarly, the ANDed output of the data buses I/O3 and I/O4 is transmitted via node TD2 to an AND circuit 47, while the AND output of the data buses I/O5 and I/O6 and the AND output of the data buses,I/O7 and I/O8 are transmitted via nodes TD3 and TD4 to the AND circuit 47, respectively. During the testing mode, the switch 3 is connected to the side of the terminal N2 by the test enable signal TE, so that the output of the AND circuit 47 is supplied by an output buffer to the external terminal as the output data Dout. Therefore, when the input data Din latched in the latch circuit 42 is at "H" level, Dout is at "H" level only when all of the data buses I/O1 to I/O8 are at "H" level. Conversely, when at least one bit in the data buses in the I/O1 to I/O8 is in error and, of course, when all of the eight bits are in error by data inversion, Dout = "L", so that any errors can be detected. On the other hand, when the input data Din latched in the latch circuit 42 is at "L" level, the transfer gates 43 and 44 are turned off and on, respectively, so that the output of the NOR circuit 46 having the data buses I/O1 and I/O2 as the inputs is entered via node TD1 to the AND circuit 47. Similarly, the NOR output of the data buses I/O3 and I/O4 is transmitted via node TD2 to the AND circuit 47, while the NOR output of the data buses I/O5 and I/O6 and the NOR output of the data buses I/O7 and I/O8 are supplied via nodes TD3 and TD4 to the AND circuit 47. Therefore, in this case, Dout = "H" only when all of the data buses I/O1 to I/O8 are all at "L" level and Dout = "L" if otherwise. In this manner, not only when the input data Din for testing is at "L" level, but when it is in the "H" level, Dout = "H" only when all of the eight bits have been read out correctly and Dout = "L" if otherwise, so that any errors can be detected.

Also, the checking system used is the "1, 0 checking system", and the Hi - Z state is not used as the Dout level, so that the testing circuit can be advantageously employed for testing the RAMs built into pre-existing systems. Moreover, in comparison with the conventional testing mode employing the "0, 1 checking system", the system is not loaded by an operation not experienced by the system.

In an embodiment shown in FIG. 5, only one latch circuit for fetching the input data is provided, so that the present testing circuit may be applied most conveniently to a so-called all "0" test pattern or to the all "1" test pattern in which the same data are written into and read out from all of the memory cells. However, when the test pattern is such that the writing cycle and the read-out cycle are executed continuously, the input data may be changed optionally during operation of the testing circuit.

Figure 6:
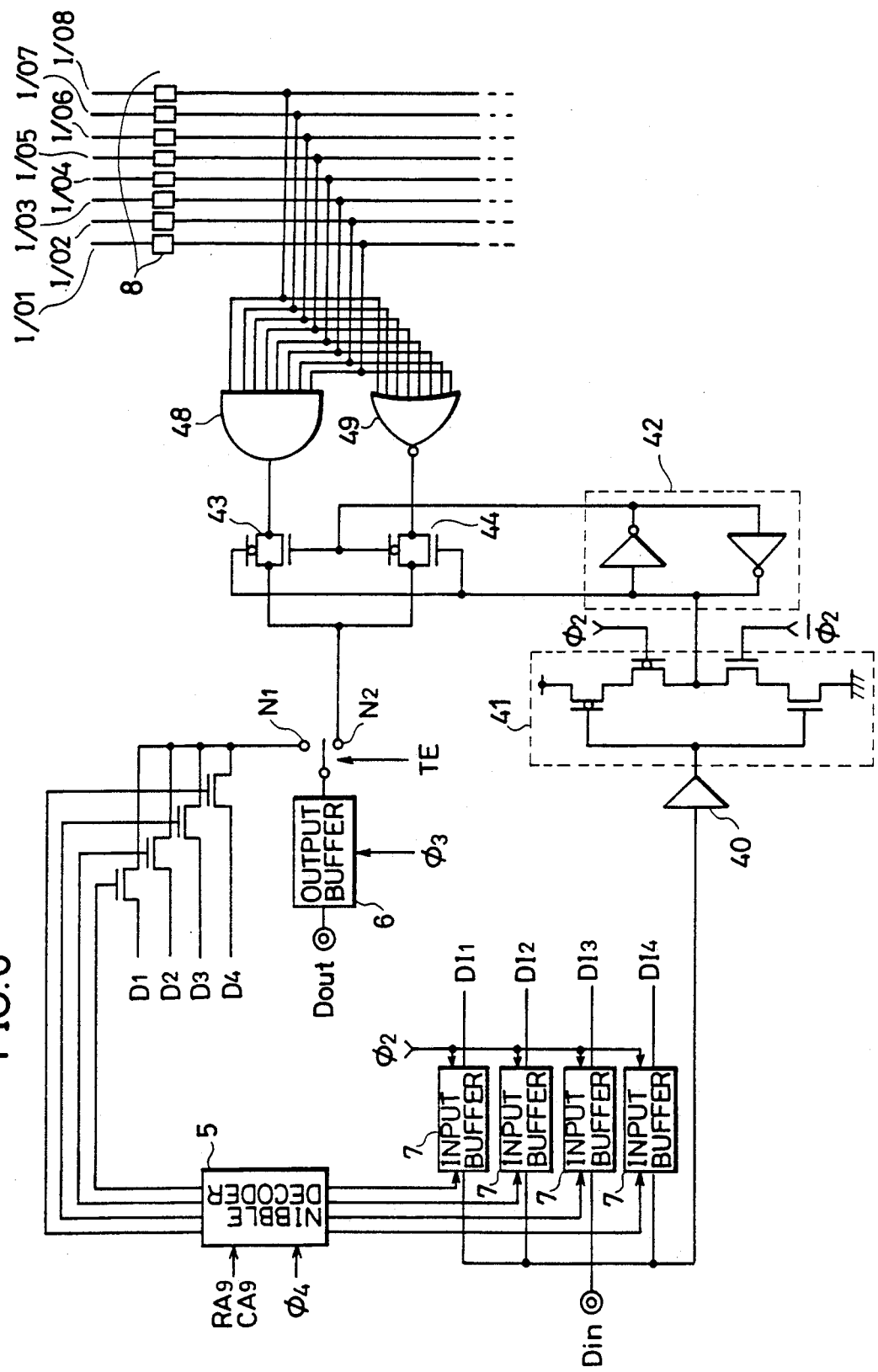
FIG. 6 is a circuit diagram showing another embodiment of the present invention.
Figure 7:
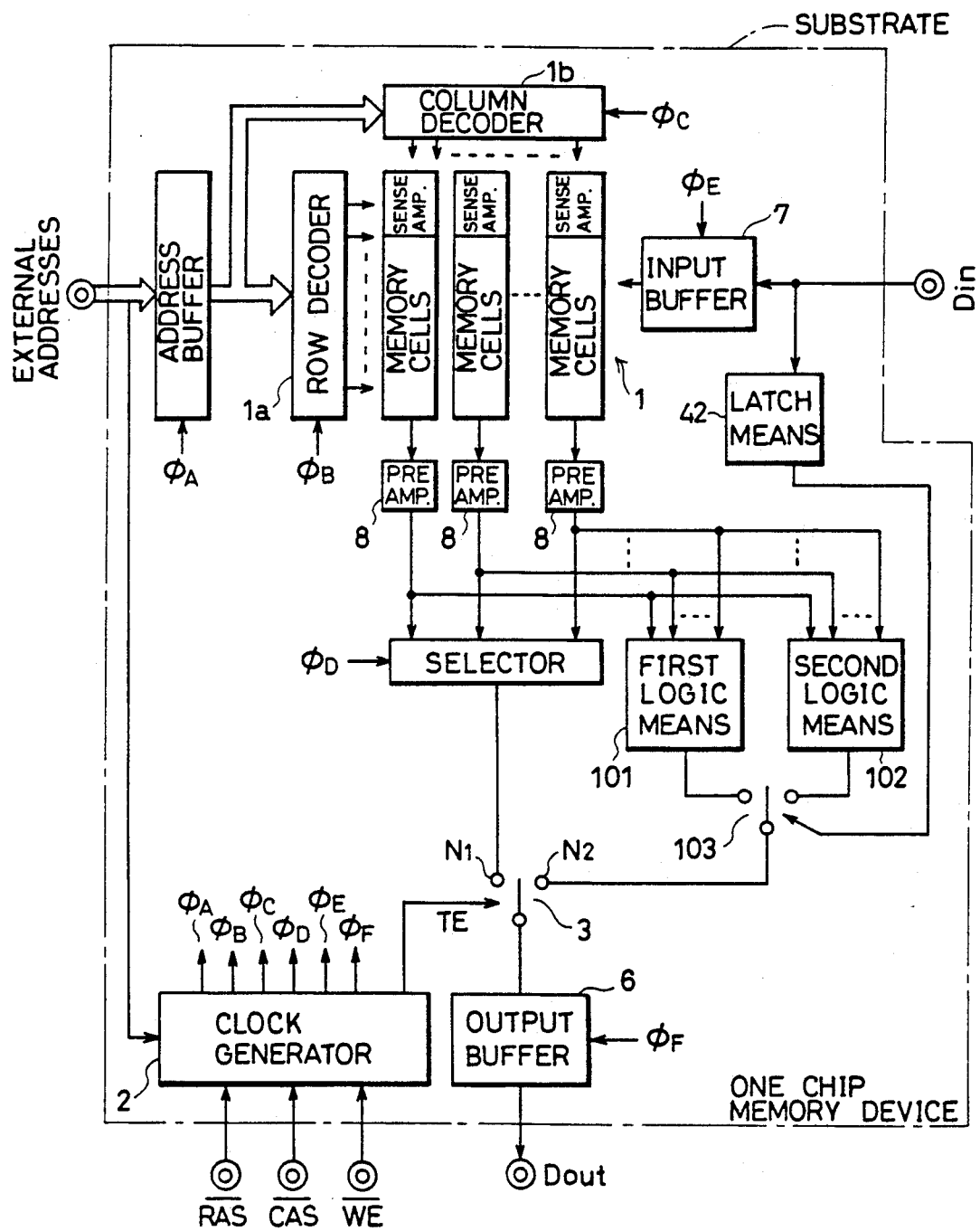
FIG. 7 is a function block diagram schematically showing the structure of an embodiment of the present invention.

FIG. 6 shows a circuit diagram showing the arrangement of a modified embodiment of the present invention, wherein the parts which are the same as or equivalent to those of the embodiment of FIG. 5 are indicated by the same reference numerals and the corresponding description is omitted for simplicity. Although not shown in FIG. 6, the address buffer, the predecoder 4 and the clock generator 2 which are the same as those of the prior art example of FIG. 1 are provided, similarly to the embodiment shown in FIG. 5. The difference of the embodiment of FIG. 6 from that of FIG. 5 is that the logical operation is performed in the latter for each two bits by the AND circuit 45 and the NOR circuit 46, whereas, in the former, the logical operation of all of the read-out eight bits is performed from the outset by the AND circuit 48 and the NOR circuit 49. When the input data latched by the latch circuit 42 during writing is at "H" level, transfer gates 43 and 44 are turned on and off, respectively, so that the output of the AND circuit 48 is outputted as the output data Dout. In this case, when all of the 8-bit data of the data buses I/O1 to I/O8 are read out correctly, that is, when all of the bit data are at "H" level, Dout = "H", and, if otherwise, Dout = "L". When the input data latched in the latch circuit 42 is at "L", the transfer gates 43 and 44 are turned off and on, respectively, so that the output of the NOR circuit 49 is outputted as the output data Dout. In this case, when all of the 8-bit data on the data buses I/O1 to I/O8 are at "L" level, Dout = "H" and, if otherwise Dout = "L". Thus, in the embodiment of FIG. 6, Dout = "H" only when all of the read-out 8-bit data are correctly read, and Dout = "L", if otherwise, that is, if any error exists in the read-out data, as in the embodiment of FIG. 5, so that any errors can be detected. Also, the Hi - Z state is not used as the Dout level, so that the circuit may be used for testing RAMs built into systems.

Although the foregoing description has been made of the case of testing eight bit arranged in parallel, the number of the tested bits arranged in parallel may be arbitrarily set to any other figure than eight within the scope of the present invention.

Also the present invention may be applied not only to DRAMs but to static RAMs.

It will be seen from the foregoing that the present invention provides an arrangement in which the state or mode of the logical operation used for checking the test results may be changed in accordance with the logical states of the bit data written for testing, so that any errors can be detected, and a testing circuit exhibiting high precision may be provided which is suitable for testing semiconductor memory devices built into existing systems.

Although the present invention has been described and illustrated in detail, it is clearly understood that the same is by way of illustration and example only and is not to be taken by way of limitation, the spirit and scope of the present invention being limited only by the terms of the appended claims.

WHAT IS CLAIMED IS

1. A testing circuit for a semiconductor memory device including an array of memory cells divided into a plurality of blocks, means for selecting a desired memory cell in each of said blocks, and means for loading and reading in parallel at least a test pattern of bits, all of a like selected logic level, comprising logic means for performing a a logical operation on data read in parallel from said selected cell in each said block of said memory and outputting the result of said logical operation, and logical operation switching means for switching the logical operation between a first logical operation and a second logical operation responsive to said like selected logic level.

2. A testing circuit for a semiconductor device according to claim 1, wherein said logical operation switching means outputs the first logical operation comprising of an AND operation when said selected logic level is "1" and outputs the second logical operations comprising of a NOR operation when said logic level is "0".

3. A testing circuit for a semiconductor device according to claim 1, further comprising latch means for storing said like selected logic level and outputting said selected logic level to said logical operation switching means.

4. In a circuit for testing a memory device in which the memory cells are divided into a plurality of groups and in which the test procedure writes a test signal of a given logic level into a selected cell in each group and selected of each group is out put in parallel, the improvement comprising a latch means for receiving and holding a signal of the given logic level of the test signal, first logic means connected to receive the output of each selected cells of at least two of said groups, second logic means connected to receive the output of each selected cell of said at least two groups of said plurality of groups, and at least one pair of transfer gate means connected to receive an output of said latch means and to pass an output of said first logic means to an output terminal responsive to one logic level of the output of said latch means and to pass an output of said second logic means to said output terminal responsive to another logic level of said latch means, wherein single and multiple cell errors are reported identically for both logic levels.

5. In a circuit for testing a memory device in which the memory cells are divided into a plurality of groups and in which the test procedure writes a test signal of a given logic level into a selected cell in each group and selected of each group is out put in parallel, the improvement comprising a latch means for receiving and holding a signal of the given logic level of the test signal, first logic means connected to receive the output of the selected cells of at least two of said groups, second logic means connected to receive the output of each selected cells of said at least two groups of said plurality of groups, at least one pair of transfer gate means connected to receive an output of said latch means and to pass an the output of said first logic means to an output terminal responsive to one logic level of the output of said latch means and to pass an output of said second logic means to said output terminal responsive to another logic level of said latch means, wherein single and multiple cell errors are reported identically for both logic levels, and wherein more than one pair of said transfer gates are provided, the improvement further comprising coincidence detection gate means interposed between said transfer gates and said output terminal and connected to receive an output of said more than one pair of said transfer gates and to deliver a predetermined logic level to said output terminal on coincidence of all outputs of said more than one pair of transfer gates at a logic level indicative of correct operation of any selected cell in respective groups of said plurality of groups and to deliver a second logic level to said output terminal upon the condition that any output of any one of said pairs of transfer gates is of a logic level indicative of incorrect operation of any selected cell in respective groups of said plurality of groups.

6. In a method of testing memory structures in which memory cells are divided into at least two groups and, for testing, a selected logic level is written into a selected cell in all of said groups, an improved method of reporting multiple errors in selected cells in plural groups comprising latching a logic level to be written into each selected cell, detecting coincidence of respective logic levels of each selected cell at a first logic level, detecting coincidence of respective logic levels of each selected cell at a second logic level, and selectively transferring a result of one of said detecting steps to an output terminal in response to the logic level latched during said latching step.

7. A semiconductor memory device comprising an array of memory cells divided into a plurality of blocks and means for selecting a desired memory cell in each block of said plurality of blocks in combination with a testing means for testing said semiconductor memory integrated therewith on a common substrate wherein said testing means comprises means for loading and reading in parallel at least a test pattern of bits, all of a like selected logic level, means for performing a a logic operation on data read in parallel from said desired memory cell in each block of plurality of blocks of said array and outputting a result of said logical operation, and logical operation switching means for switching the logical operation between a first logical operation and a second logical operation responsive to said like selected logic level.

8. The combination of claim 7, further including latch means for storing said like selected logic level and outputting said like selected logic level to said logical operation switching means.

* * * * *